United States Patent
Grosskreuz et al.

(10) Patent No.: US 11,369,047 B2
(45) Date of Patent: Jun. 21, 2022

(54) POWER MODULE HEAT SINK WITH HIGH CONDUCTIVITY HEAT SPREADER

(71) Applicant: Rockwell Automation Technologies, Inc., Mayfield Heights, OH (US)

(72) Inventors: Paul J. Grosskreuz, West Bend, WI (US); Jeffrey W. Dujmovic, Milwaukee, WI (US); Avijit Bhunia, Newbury Park, CA (US); Seongchul Jun, Thousand Oaks, CA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 31 days.

(21) Appl. No.: 16/416,652

(22) Filed: May 20, 2019

(65) Prior Publication Data
US 2020/0375070 A1    Nov. 26, 2020

(51) Int. Cl.
*H05K 7/20*    (2006.01)

(52) U.S. Cl.
CPC ..... *H05K 7/20936* (2013.01); *H05K 7/20336* (2013.01); *F28F 2210/10* (2013.01)

(58) Field of Classification Search
CPC ........ H01L 23/467; H01L 23/427; F28F 3/12; F28F 2210/10; F28F 1/02; H05K 7/20936; H05K 7/20336; F28D 1/035; F28D 1/0383; F28D 1/0471
See application file for complete search history.

(56) References Cited

U.S. PATENT DOCUMENTS

| | | | | |
|---|---|---|---|---|
| 4,478,277 A | * | 10/1984 | Friedman | H01M 10/613 165/185 |
| 5,901,037 A | * | 5/1999 | Hamilton | F28F 3/12 165/80.4 |
| 6,301,109 B1 | * | 10/2001 | Chu | F28F 3/12 165/165 |
| 7,791,884 B2 | | 9/2010 | Huang et al. | |
| 10,680,488 B2 | * | 6/2020 | Yokoyama | H02K 11/33 |
| 2003/0178182 A1 | * | 9/2003 | Pikovsky | F28F 3/12 165/80.4 |
| 2004/0066643 A1 | * | 4/2004 | Beihoff | H02M 1/44 361/816 |
| 2005/0253465 A1 | * | 11/2005 | Takenaka | H02K 5/20 310/52 |
| 2009/0101308 A1 | * | 4/2009 | Hardesty | F28D 15/0233 165/80.4 |
| 2010/0118493 A1 | | 5/2010 | Huang et al. | |
| 2012/0160900 A1 | * | 6/2012 | Rigal | B23K 20/02 228/161 |
| 2012/0325447 A1 | * | 12/2012 | You | H01M 10/625 165/170 |
| 2015/0136358 A1 | * | 5/2015 | Gradinger | H01L 23/427 165/80.3 |
| 2015/0163962 A1 | * | 6/2015 | Suzuki | H05K 1/0203 361/699 |

(Continued)

*Primary Examiner* — Tho V Duong
(74) *Attorney, Agent, or Firm* — Fay Sharpe LLP

(57) ABSTRACT

A heat sink for use with a heat generating component such as an electronic power module comprises a first substrate having a serpentine slot, a second substrate secured to a first side of the first substrate to form a combined substrate, surfaces of the first and second substrates at least partially forming a serpentine passageway within the combined substrate for containing a fluid. The serpentine passageway has a non-circular cross-sectional shape.

15 Claims, 4 Drawing Sheets

(56) References Cited

U.S. PATENT DOCUMENTS

2016/0036104 A1\* 2/2016 Kenney .................. F28F 13/08
                                                        429/120
2018/0269547 A1\* 9/2018 Robert ................ H01M 2/0287

\* cited by examiner

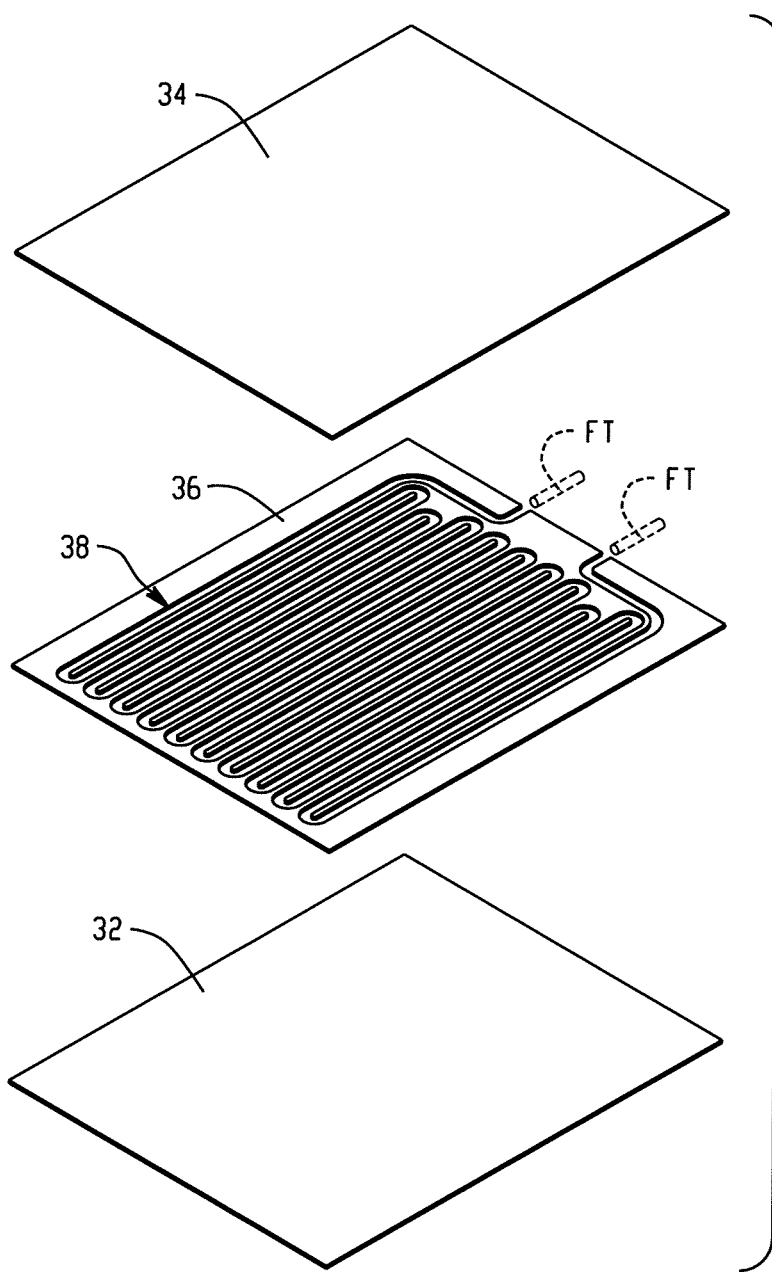
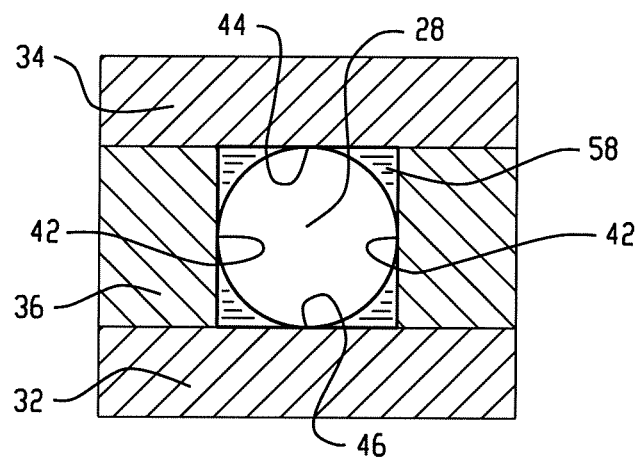

POWER MODULE HEAT SINK WITH HIGH CONDUCTIVITY HEAT SPREADER

BACKGROUND INFORMATION

Motor drives are power conversion systems or "converters" that operate to provide power to electric motors in a controlled fashion to control one or more motor performance parameters, such as speed, torque, etc. Medium voltage current-sourced type motor drives typically receive multi-phase AC input power in the range of about 2,400 to 6,900 volts, which is converted in a rectifier to DC power supplied to a DC link and provided from the DC link to an inverter. The inverter switches the DC link currents to provide AC output current to a motor load with the output current being controlled by the inverter in closed loop fashion to drive the motor at a desired speed and/or torque. The rectifier is generally an active switching type rectifier that selectively activates switches to provide current from the AC input to the DC link bus to achieve AC to DC power conversion, where the rectifier gain is controlled to provide a DC link current level at the peak current level required by the motor at any given time. The inverter, in turn, implements a switching scheme to selectively connect the motor leads to the DC link bus terminals to provide motor phase currents with controlled amplitudes, phase, and frequency to implement a particular motor control strategy based on motor performance feedback values and desired performance setpoints or profiles. Voltage source drives are similar but the DC link supplies a select constant DC voltage instead of a select constant DC current.

The rectifier and inverter switches are solid state devices such as, e.g., gate turnoff thyristors (GTOs), silicon controlled rectifiers (SCRs), insulated gate bipolar transistors (IGBTs), symmetrical gate commutated thyristors (SCGTs) or the like. Regardless of the exact type, these switches generate large amounts of heat that must be dissipated.

Commonly owned U.S. patent publication no. 2002/0089056A1 provides one example of such a motor drive, and the disclosure of said U.S. patent publication no. 2002/0089056A1 is hereby expressly incorporated into the present specification. U.S. patent publication no. 2002/0089056A1 discloses an air cooled motor drive wherein the switches of the rectifier and inverter are defined as "press-pack" switch devices mounted on respective printed circuit boards (PCBs). Each PCB includes a bracket adapted to be secured to a mounting location (such as a heat sink). When each PCB is operatively installed, the opposite terminals of its respective press-pack switch device are abutted with respective first and second heat sinks between which the PCB and switch are located for electrical and thermal conductivity between the heat sinks and the press-pack switch device, with electrical conductivity between the two heat sinks being controlled by the press-pack switch, itself. The heat sinks are electrically connected to power lugs which are, in turn, connected to power connectors for input or output of electrical power. The heat sinks are cooled by forced air flow generated by a fan or other source. For higher power applications, however, the heat sinks do not provide enough cooling. As such, a need has been found for such a motor drive with improved air cooling.

BRIEF DESCRIPTION

In accordance with one aspect, a heat sink for use with a heat generating component comprises a first substrate having a serpentine slot, a second substrate secured to a first side of the first substrate to form a combined substrate, surfaces of the first and second substrates at least partially forming a serpentine passageway within the combined substrate for containing a fluid. The serpentine passageway has a non-circular cross-sectional shape.

The heat sink can further include a third substrate secured to a second side of the first substrate opposite the second substrate, wherein surfaces of the first, second and third substrates form the serpentine passageway. The serpentine slot can have a rectangular cross-sectional shape, and planar surfaces of the first, second and third substrates can form four sides of the of the serpentine passageway. The first and second substrates can be bonded together. The serpentine passageway can be an open loop. The serpentine passageway can include a plurality of elongate segments and a plurality of curved segments connecting adjacent elongate segments. The serpentine passageway can have a width of less than 5 mm and the curved segments have a radius of curvature less than 10 mm. In one example, the width is approximately 2 mm and the radius of curvature is approximately 3.5 mm. The heat sink can further include a plurality of fins mounted to a first side of the combined substrate for dissipating heat and/or the heat generating component engaged with a second side of the combined substrate opposite the plurality of fins.

In accordance with another aspect, a motor drive comprises an enclosure, a heat sink supported in the enclosure, the heat sink having a first substrate having a serpentine slot, a second substrate secured to a first side of the first substrate to form a combined substrate, surfaces of the first and second substrates at least partially forming a serpentine passageway within the combined substrate for containing a fluid, the serpentine passageway having a non-circular cross-sectional shape, and a heat generating component engaged with the heat sink.

The heat sink can further include a third substrate secured to a second side of the first substrate opposite the second substrate, and the surfaces of the first, second and third substrates can form the serpentine passageway. The serpentine slot can have a rectangular cross-sectional shape, and the planar surfaces of the first second and third substrates can form four sides of the serpentine passageway. The serpentine passageway can include a plurality of elongate segments and a plurality of curved segments connecting adjacent elongate segments, and the heat sink can be supported in the enclosure in an orientation such that the elongate segments extend in a non-vertical plane. The heat sink can further include a plurality of fins for dissipating heat mounted to the combined substrates on an opposite side from the heat generating component. The heat generating component has a footprint that is 50% less than (in one example, approximately 34%) of the areal extent of the surface of the heat sink to which it is mounted, whereby heat generated by the heat generating component is transported away from the heat generating component via the serpentine passageway. In one example, In accordance with another aspect, a method of making a heat sink comprises forming a slot in a first substrate, said slot extending from a first side of the first substrate to a second side of the first substrate, enclosing the slot by securing a second substrate to the first side of the first substrate and securing a third substrate to the second side of the first substrate, wherein respective surfaces of the first, second and third substrates form a passageway within the combined substrates, and filling the passageway with a quantity of fluid.

The passageway can be a serpentine passageway having a plurality of elongate segments and a plurality of curved segments, the passageway being formed in the first substrate by removing material from the first substrate. The forming the slot in the first substrate can include at least one of stamping, milling, or cutting the first substrate. The substrates can be bonded together by at least one of welding, brazing, diffusion bonding or with an adhesive. The forming the slot can include forming a slot having first and second sides extending in parallel planes, and wherein planar surfaces of the second and third substrate enclose the slot to form a passageway having a rectangular cross-sectional shape.

BRIEF DESCRIPTION OF THE DRAWINGS

FIG. 5 is an exploded view of the heat sink of FIG. 3;

FIG. 6 is an enlarged portion of FIG. 4;

DETAILED DESCRIPTION

Figure 1:
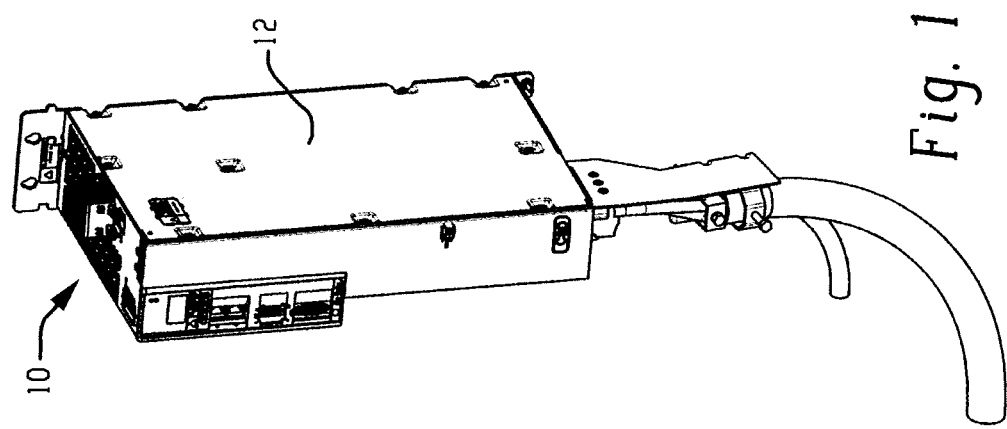
FIG. 1 is perspective view of an exemplary enclosure in accordance with the present disclosure.

In FIG. 1, an exemplary motor drive enclosure is illustrated and identified generally by reference numeral 10. The motor drive enclosure 10 includes a housing 12 in which a plurality of heat generating components are supported. For the purposes of the following disclosure, the specific details of the motor drive enclosure 10 need not be described in detail because aspect of the present disclosure can be utilized in conjunction with a wide variety of motor drive enclosures and/or other devices where heat dissipation is desired. Thus, for the sake of brevity, the enclosure 10 and internal components thereof are only generally described to the extent necessary to provide context for the main features of the present disclosure.

Figure 2:
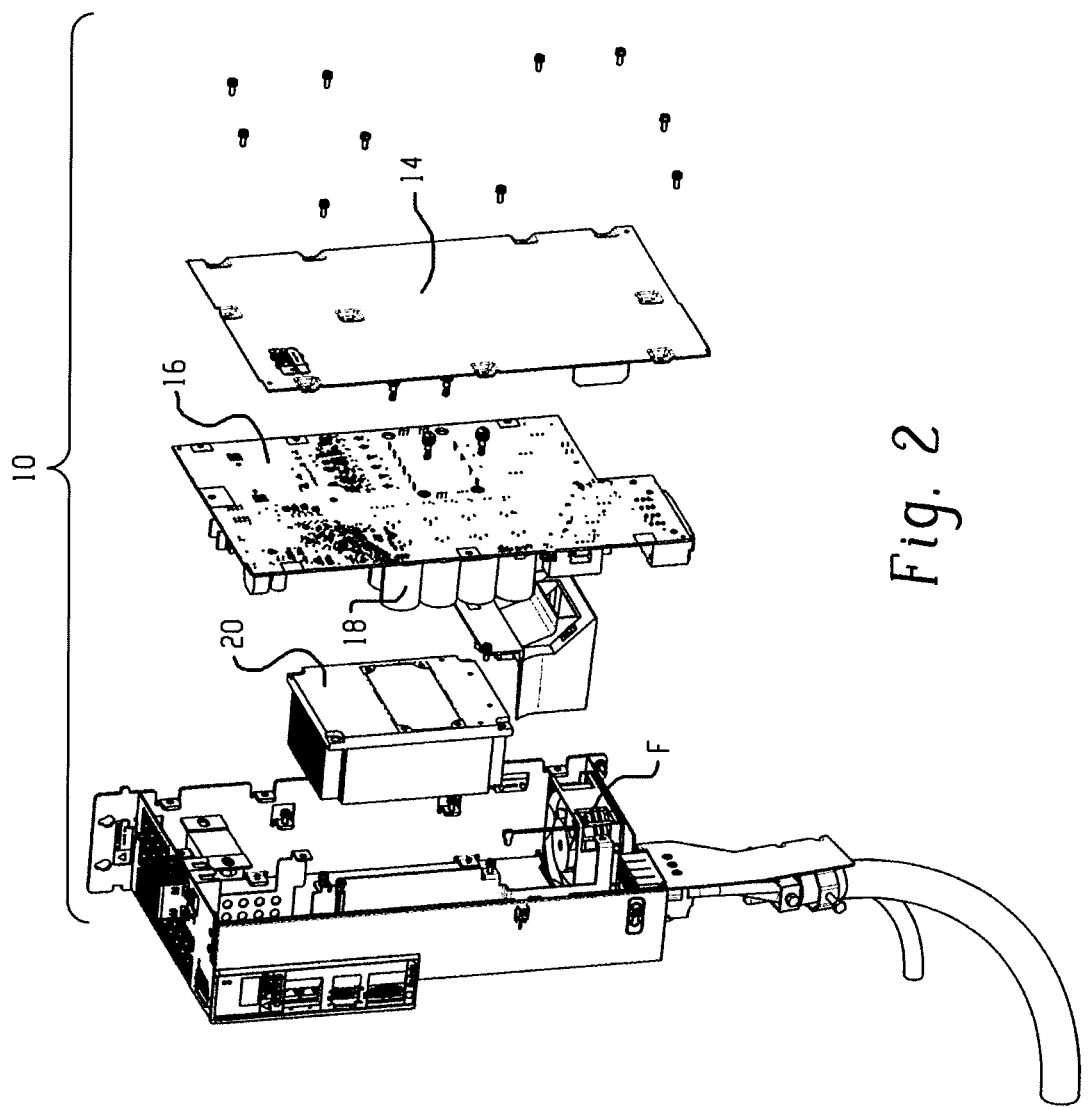
FIG. 2 is an exploded view of the enclosure of FIG. 1.

With additional reference to FIG. 2, a cover panel 14 of the housing 12 has been removed therefrom to expose internal features of the motor drive enclosure 10. Supported within an interior chamber of the motor drive enclosure 10 is a power board 16 on which are supported a variety of electrical components 18. Electrical components 18 can include any of the electrical components mentioned above and, as will be appreciated, the any type of heat generating component can be used in conjunction with aspects of the present disclosure.

A heat sink 20 is also supported within the motor drive enclosure 10. The heat sink 20, as will be described in more detail below, is configured to absorb heat from the power board 16 and/or related electrical components 18 (e.g., an electronic power module) and dissipate the absorbed heat to the ambient environment. In the illustrated embodiment, a fan F is provided for drawing ambient air into the enclosure 10, circulating the ambient air across the heat sink 20, and discharging the ambient air back to the environment. In some embodiments, the fan F can be omitted and dissipation of heat from the heat sink can occur via natural convective processes.

Turning now to FIGS. 3-8, the details of the exemplary heat sink 20 will be described. The heat sink 20 includes a heat sink base 22 on which is mounted an electrical component 18. The heat sink 20 further includes a plurality of fins 24 mounted to the heat sink base 22 on an opposite side from the electrical component 18. It will be appreciated that the electrical component 18 in FIGS. 3-8 is schematically illustrated but could generally correspond to the power board 16 and/or electrical components 18 shown in FIG. 2. The heat sink 20 is configured to absorb heat from the electrical component 18 and dissipate the heat to the ambient environment via the plurality of fins 24.

Figure 3:
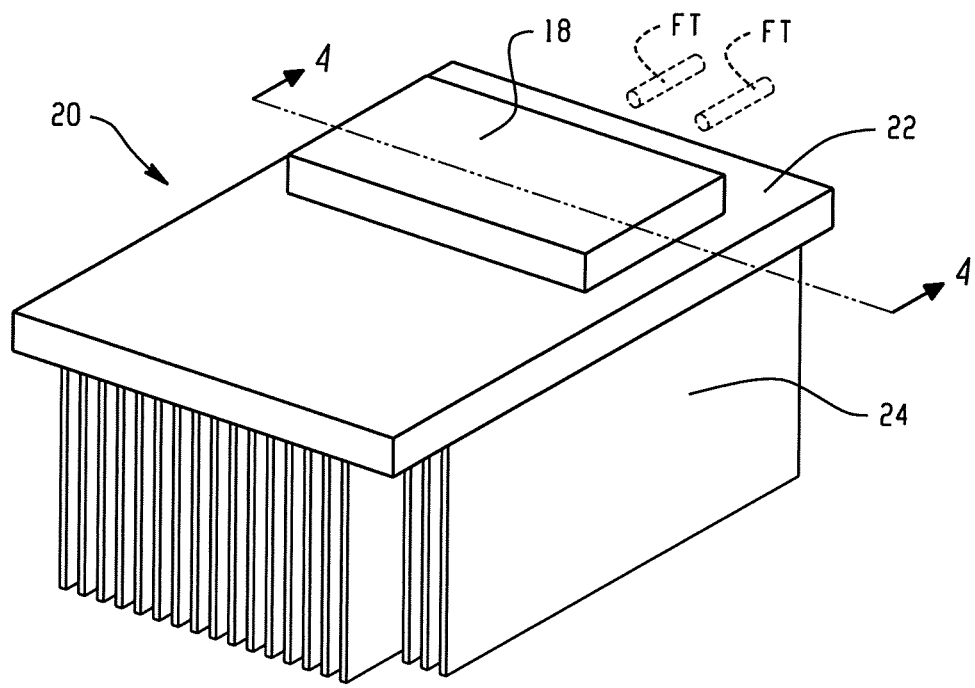
FIG. 3 is a perspective view of an exemplary heat sink and heat generating component in accordance with the present disclosure.
Figure 4:
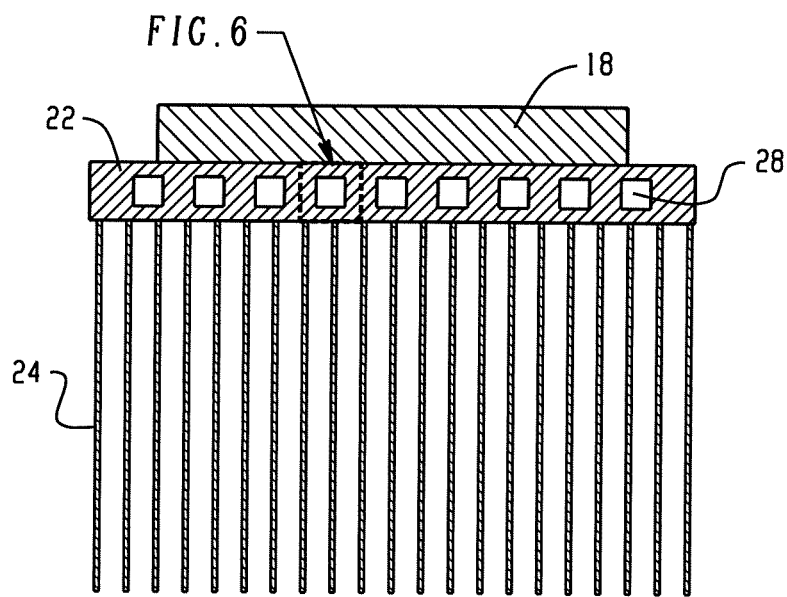
FIG. 4 is a cross-sectional view of the heat sink and heat generating component of taken along the line 4-4 in FIG. 3.

In accordance with the present disclosure, the heat sink 20 includes a serpentine passageway 28 within the heat sink base 22. The serpentine passageway 28 is at least partially filled with a fluid to facilitate transfer of thermal energy from the electrical component 18 throughout the heat sink base 22. To this end, it should be appreciated that as shown in FIG. 3 the electrical component 18 occupies a relatively smaller area of the heat sink base 22 such that the physical thermal interface between the electrical component 18 and heat sink base 22 limits the amount of heat that can be transferred from the electrical component 18 to the heat sink base 22 and ultimately dissipated via plurality of fins 24. In other words, because the surface of the electrical component is smaller than the surface area of the heat sink base 22, heat transfer to the heat sink base 22 via strictly conductive processes is limited. However, the serpentine passageway 28 and the fluid contained therein functions to increase the rate of thermal transfer of energy from the electrical component 18 to the heat sink base 22 by more thoroughly distributing heat laterally within the heat sink base 22 thereby allowing more efficient use of the heat sink base 22.

Turning to FIG. 5, the heat sink 20 of the exemplary embodiment is constructed from three substrates. A bottom substrate 32 and a top substrate 34 are secured to opposite sides of a middle substrate 36 to form the heat sink base 22 (e.g., a combined substrate). The middle substrate 36 includes a serpentine slot 38 that extends from a first side of the middle substrate to a second side of the middle substrate 36. That is, the serpentine slot 38 extends entirely through the middle substrate 36.

In FIG. 6, it can be seen that the serpentine passageway 28 has a generally rectangular cross-section formed by first and second vertical sidewalls 42 of the middle substrate 36 defining the serpentine slot 38, and upper and lower walls 44 and 46 of the top substrate 34 and bottom substrate 32, respectively.

Figure 7:
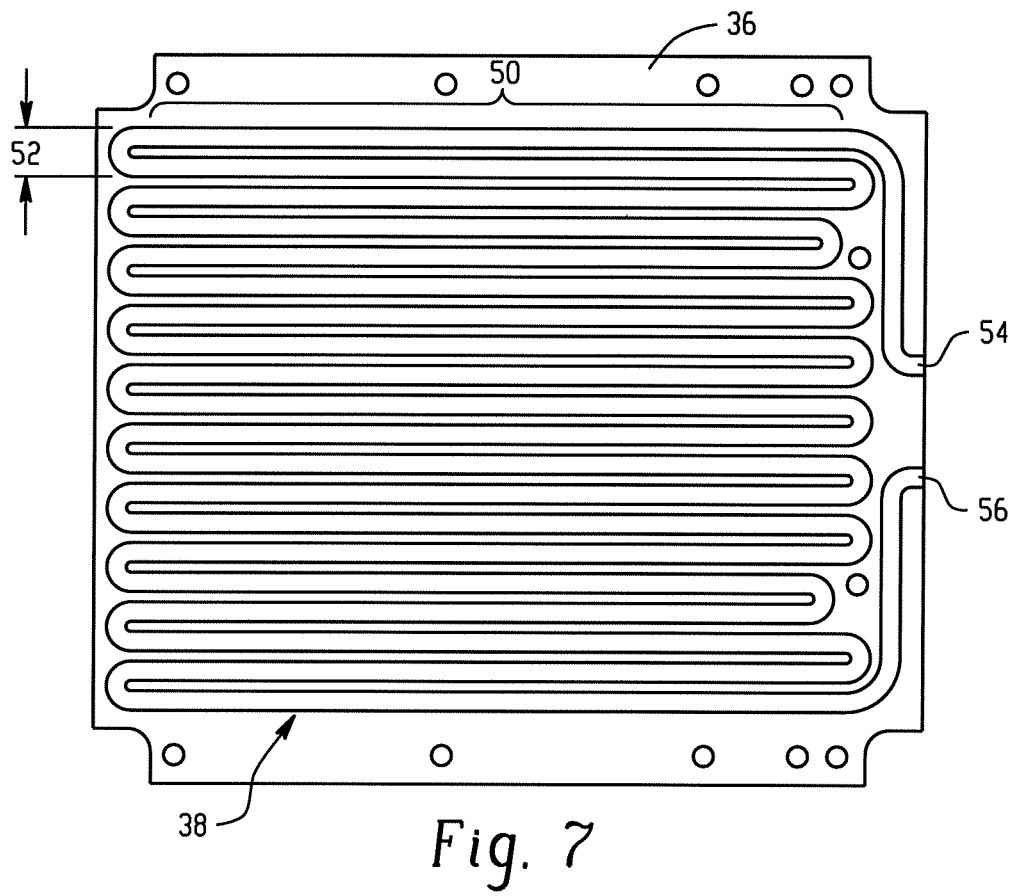
FIG. 7 is a plan view of a substrate having a serpentine slot in accordance with the present disclosure.

With reference to FIG. 7, the serpentine slot 38 is comprised of a plurality of elongate segments 50 and a plurality of curved segments 52. In general, the serpentine slot 38 is configured to cover a majority of the aerial extent of the middle substrate 36. In the illustrated embodiment, the serpentine slot 38 forms an open loop such that first and second ends 54 and 56 of the serpentine slot 38 do not meet. In other embodiments, the serpentine slot 38 could be configured as a closed loop. It should be appreciated that the open loop configuration simplifies manufacturing and assembly of the heat sink 20 because the middle substrate 36 remains a single piece (e.g., connected via material between first and second ends 54 and 56 of the serpentine slot 38) such that it can be easier to manipulate the middle substrate 36 during manufacturing when securing the top substrate 34 and bottom substrate 32 thereto. In the case of a closed loop configuration, the middle substrate 36 would be separated into two pieces (e.g., material removed between first and second ends 54 and 56 of the serpentine slot 38) such that manipulation of the middle substrate 36 during processing can be more difficult.

It should be appreciated that the bottom substrate 32 and top substrate 34 can be secured to the middle substrate 36 using a variety of different methods. In some examples, the substrates can be bonded together via a brazing, diffusion bonding or welding process whereby the materials of the respective substrates are metallurgically bonded together. In other examples, an adhesive can be used to join the top and bottom substrates to the middle substrate 36.

Once the substrates are joined together, fill tubes can be used to inject a quantity of fluid into the serpentine passageway 28 via fill ports (not shown). The fill ports are then sealed shut to trap the fluid within the serpentine passageway.

Referring back to FIG. 6, the rectangular cross-sectional shape of the serpentine passageway 28 increases the amount of surface area available for the transfer of heat from the substrates 32, 34, 36 to a fluid 58 within the serpentine passageway 28 as compared to a circular cross-sectional shape (e.g., bent tube). In addition, the sharp edges of the corners of the rectangular cross-sectional shape of the serpentine passageway 28 enhances wetting of the fluid 58 on the respective surfaces of the substrates 32, 34 and 36.

Figure 8:
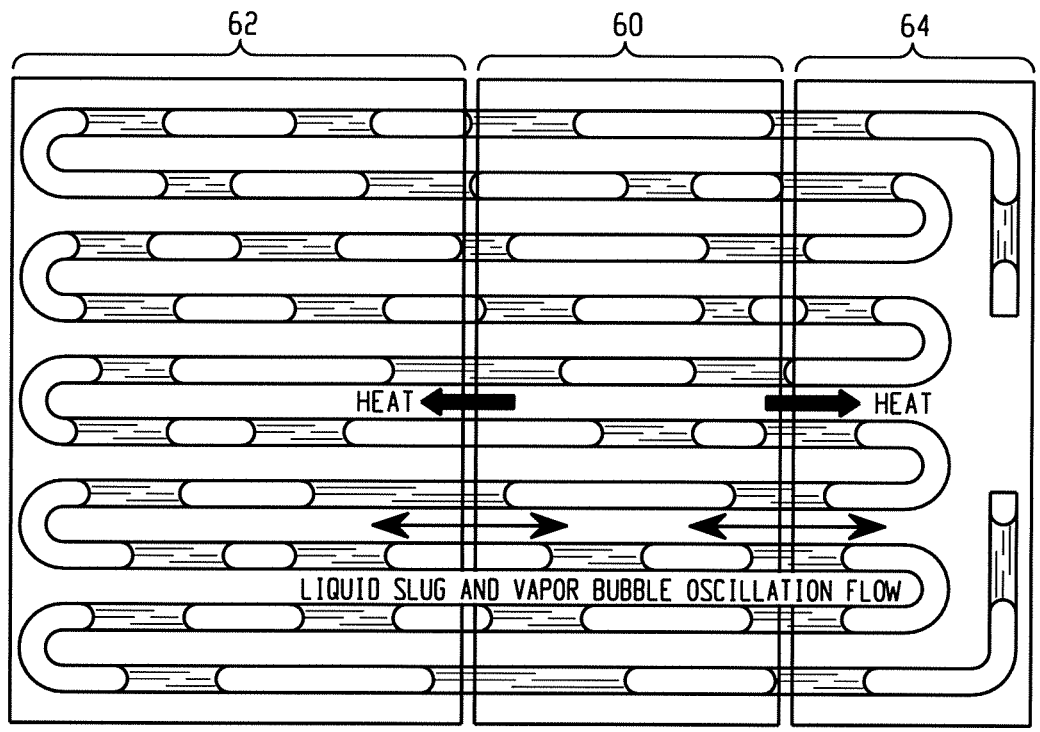
FIG. 8 is a schematic view of heat flow within a heat sink in accordance with the present disclosure.

Turning now to FIG. 8, the heat sink 20 is illustrated schematically to show the manner in which heat is adapted to flow throughout the heat sink base 22 via the serpentine passageway 28. In this illustration, a center portion 60 of the heat sink 20 supports a heat generating component (e.g., an electrical component 18) while the outer portions 62 and 64 are adapted to receive thermal energy via the transfer of heat through the serpentine passageway 28. To this end, the fluid 58 within the serpentine passageway 28 absorbs heat in region 60 and partially or totally converts to a vapor form within the region 60. As the fluid within region 60 is converted to vapor form, the vapor is caused to flow laterally in the upper portion of the serpentine passageway 28 to regions 62 and/or 64. When the vapor reaches regions 62 and 64 the vapor condenses back into a liquid thereby transferring thermal energy to regions 62 and 64 from region 60. The condensed liquid is then caused to flow back to region 60, and the process repeats. The resulting effect is that heat generated by the heat generating component is transferred more efficiently into region 60 by virtue of the liquid fluid 58 within region 60, and dissipated laterally to regions 62 and 64 via the vapor fluid 58.

Returning back to FIG. 3, it should be appreciated that the heat sink 20 of the present disclosure provides a more efficient transfer of thermal energy from the electrical component 18 ultimately to the plurality of fins 24 for dissipation into the environment. By providing the serpentine passageway 28 and fluid 58 therein, heat generated in a localized region of the heat sink 20 is more efficiently transferred laterally to the entire heat sink base 22 and subsequently to the plurality of fins 24.

The heat sink 20 of the present disclosure is amenable to batch manufacturing. To this end, the middle substrate can be a stamped component. In some examples, the passageway can be filled in a range of 20-80 percent (e.g., fluid volume to passageway volume ratio).

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. A motor drive for controlling a voltage and a current supplied to a motor to achieve a desired motion comprising:
   a housing;
   a power control circuit board retained within the housing;
      an electrical connector mounted through the housing for supplying a voltage and a current to a motor through at least one electrical cable mated to the connector
   a plurality of solid-state devices mounted to the power control board for producing a voltage or current to be supplied to the motor through the cable and generating thermal energy as a result;
      a heat sink positioned within the housing to absorb thermal energy generated by at least one of the plurality of solid-state devices, the heat sink having a first substrate having a serpentine slot formed from a stamping process, the serpentine slot having with first and second ends of the slot opening to a common side of the first substrate, a second substrate secured to a first side of the first substrate and a third substrate secured to a second side of the first substrate opposite the second substrate to form a combined substrate, wherein surfaces of the first, second and third substrates cooperate to form a serpentine passageway within the combined substrate for containing a fluid the serpentine passageway having a non-circular cross-sectional shape.

2. The motor drive of claim 1, wherein serpentine slot has a rectangular cross-sectional shape, and wherein planar surfaces of the first, second and third substrates form four sides of the of the serpentine passageway.

3. The motor drive of claim 1, wherein the first and second substrates are bonded together.

4. The motor drive of claim 1, wherein the serpentine passageway is an open loop.

5. The motor drive of claim 1, wherein the serpentine passageway includes a plurality of elongate segments and a plurality of curved segments connecting adjacent elongate segments.

6. The motor drive of claim 5, wherein the serpentine passageway has a width of less than 5 mm, and wherein the curved segments have a radius of less than 10 mm.

7. The motor drive of claim 1, further comprising a plurality of fins mounted to a first side of the combined substrate for dissipating heat.

8. A motor drive comprising:
   an enclosure; an electrical connector mounted through the enclosure for supplying a voltage and a current to a motor through at least one electrical cable mated to the connector
   a power control circuit board retained within the enclosure;
   a plurality of solid-state devices mounted to the power control board for producing a voltage or current to be supplied to the motor through the cable and generating thermal energy as a result;
   a heat sink supported in the enclosure for dissipating thermal energy generated by at least one of the plurality of solid state devices, the heat sink having a first substrate having a stamped serpentine slot with first and second ends of the slot opening to a common side of the first substrate, a second substrate secured to a first side of the first substrate and a third substrate secured to a second side of the first substrate opposite the second substrate to form a combined substrate, surfaces of the first, second and third substrates forming a serpentine passageway within the combined substrate for containing a fluid, the serpentine passageway having a non-circular cross-sectional shape; and wherein the serpentine passageway is fully embedded in the combined substrate of the heat sink.

9. The motor drive of claim 8, wherein the serpentine slot has a rectangular cross-sectional shape, and wherein planar surfaces of the first second and third substrates form four sides of the serpentine passageway.

10. The motor drive of claim 8, wherein the serpentine passageway includes a plurality of elongate segments and a plurality of curved segments connecting adjacent elongate segments, and wherein the heat sink is supported in the enclosure in an orientation such that the elongate segments extend in a non-vertical plane.

11. The motor drive of claim 8, further comprising a plurality of fins for dissipating heat mounted to the combined substrates on an opposite side from at least one of the plurality of solid-state devices.

12. The motor drive of claim 1, wherein the serpentine passageway is filled in a range of 20%-80% fluid to passageway volume.

13. The motor drive of claim 8, wherein the serpentine passageway is filled in a range of 20%-80% fluid to passageway volume.

14. The motor drive of claim 1, further comprising an electric-powered fan mounted through the housing to provide ambient airflow over the heat sink.

15. The motor drive of claim 8, further comprising an electric-powered fan mounted through the housing to provide ambient airflow over the heat sink.

* * * * *